(12) United States Patent
Jang et al.

(10) Patent No.: US 6,216,054 B1
(45) Date of Patent: Apr. 10, 2001

(54) METHOD FOR CONTROLLING PREVENTATIVE MAINTENANCE CYCLES OF SEMICONDUCTOR FABRICATING EQUIPMENT ARRANGED IN A PROCESSING LINE

(75) Inventors: Jae-man Jang, Kyonggi-do; Jai-seop Choi, Seoul; Jun Jung, Kyonggi-do, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/148,630

(22) Filed: Sep. 4, 1998

(30) Foreign Application Priority Data

Jan. 14, 1998 (KR) .................................................. 98-804

(51) Int. Cl.$^7$ .................................................. G06F 19/00
(52) U.S. Cl. .......................................... 700/121; 700/111
(58) Field of Search ..................................... 700/121, 230, 700/109, 110, 108, 111

(56) References Cited

U.S. PATENT DOCUMENTS

| | | | |
|---|---|---|---|
| 4,829,445 | * 5/1989 | Burney | 700/230 |
| 5,696,689 | * 12/1997 | Okumura | 700/121 |
| 5,751,582 | * 5/1998 | Saxena | 700/109 |
| 5,862,054 | * 1/1999 | Li | 700/121 |
| 5,923,553 | * 7/1999 | Yi | 700/110 |

* cited by examiner

Primary Examiner—William Grant
Assistant Examiner—Ronald D Hartman, Jr.
(74) Attorney, Agent, or Firm—Jones Volentine, LLC

(57) ABSTRACT

A method for controlling preventative maintenance cycles in a semiconductor fabrication system includes automatically receiving, at a preventative maintenance module (PMM) in data communication with a host computer, operating parameter data from equipment in the system. Specification data corresponding to the equipment are retrieved by the PMM from a preventative maintenance cycle data base. It is determined whether the operating parameter data exceeds the specification data at the PMM. If the operating parameter data exceeds the specification data, then a key value of a variable ID corresponding to the equipment is changed, and an operating state of the equipment is modified by inserting the variable ID into an equipment control message and downloading the equipment control message to the equipment.

11 Claims, 5 Drawing Sheets

FIG. 5

| | Equipment 1 | Equipment 2 | ... | Equipment n |
|---|---|---|---|---|
| Amount of operating time | 35,000 | 2,000 | | 18,000 |
| Number of processed wafers | 550 | 450 | | 480 |
| | ... | ... | ... | ... |

FIG. 6

| Equipment ID | Equipment 1 | Equipment 2 | ... | Equipment n |
|---|---|---|---|---|
| Equipment state | PM | RUN | ... | RUN |

METHOD FOR CONTROLLING PREVENTATIVE MAINTENANCE CYCLES OF SEMICONDUCTOR FABRICATING EQUIPMENT ARRANGED IN A PROCESSING LINE

BACKGROUND OF THE INVENTION

1. Field of the Invention

The present invention relates to a method for controlling equipment in a semiconductor manufacturing system, and more particularly, to a method for automatically controlling preventative maintenance (PM) cycles through a PM controlling module.

2. Description of the Related Art

Generally, the fabrication of semiconductor devices involves highly precise processes that require finely tuned precision equipment. Several pieces of precision equipment are typically employed in sequence and arranged on a semiconductor processing line. The operation of each piece of precision equipment on the line is closely monitored by operators to maintain and enhance the efficiency of the processing line.

As shown in FIG. 1, conventional fabrication equipment 3 are disposed on a conventional processing line. When a lot (not shown) of workpieces, such as wafers, are introduced into the equipment 3, the equipment 3 performs a fabrication process on the lot. The equipment 3 is connected on-line to a host computer 1 through an equipment server 4. An operator interface (O/I) 2, for example an operator interface personal computer (O/I PC), is also connected on-line to the host computer 1. Through the O/I 2, an operator informs the host computer 1 that a process using the equipment 3 is about to commence. The operator inputs basic manufacture data, e.g., the identification number (ID) of the lot to be processed in the equipment 3 and the ID of the equipment 3 for performing the process with the lot, into the host computer 1.

Then, based on the input basic manufacture data, the host computer 1 searches its data base for the process condition data to be applied to the process on the lot. The host computer 1 immediately downloads these process condition data, including preset process settings, to the equipment. Process settings may include, for example, a desired process time duration or a desired process temperature.

Thereafter, the operator checks the process condition data and inputs a process commencing command or a process terminating command. The lot is then automatically and rapidly routed into and out of the equipment 3. In this manner, the process equipment 3 performs on the workpieces of each lot based on the process settings received.

While the processes are being performed, various operational parameters, e.g., the amount of time the equipment 3 has been operating and the number of the wafers that have been processed in the equipment 3, are continuously monitored by the operator. In the event that certain operational parameters exceed predetermined levels that define periodic preventative maintenance cycles, the operator performs preventative maintenance on the equipment 3 to prevent, in advance, damage to the equipment.

However, such a conventional controlling system suffers from several problems. First, since detecting the preventative maintenance cycle event is determined by the subjective actions of an operator, the actual cycle may vary among operators, which results in lack of consistency in performing the preventative maintenance. Secondly, when an error occurs in detecting the preventative maintenance cycle event, the equipment may be damaged. Thirdly, in order to detect the preventative maintenance cycle event, the operator is required to be at the manufacturing line to continuously monitor the respective equipment at their own consoles, which results in reduced efficiency.

SUMMARY OF THE INVENTION

It is therefore an object of the present invention to protect processing line equipment from being damaged due to errors by the operators in detecting the preventative maintenance cycle events, by controlling the preventative maintenance cycles without any intervention by the operators.

It is another object of the present invention to reduce the time taken for the operators to monitor the equipment by automatically controlling the preventative maintenance cycle through a preventative maintenance (PM) controlling module.

To achieve the above objects and other objects and advantages of the invention, a method for controlling equipment in a semiconductor fabrication system includes automatically receiving, at a preventative maintenance module (PMM) in data communication with a host computer, operating parameter data from equipment in a semiconductor fabrication system. Specification data corresponding to the equipment are retrieved by the PMM from a preventative maintenance cycle data base. It is then determined at the PMM whether any of the operating parameter data exceeds the specification data. If any of the operating parameter data exceeds the specification data, a key value of a variable ID corresponding to the equipment is changed by the host computer. After changing the key value, an operating state of the equipment is modified, including inserting the variable ID into an equipment control message and downloading the equipment control message to the equipment.

Therefore, the present invention provides automatic control of the preventative maintenance cycles for the respective equipment.

BRIEF DESCRIPTION OF THE DRAWINGS

The present invention is described in detail with reference to the accompanying drawings, in which:

FIG. 5 is a schematic diagram of an example PM cycle specification table according to the present invention; and FIG. 6 is a schematic diagram of an example monitor display on an O/I PC informing an operator of a changed state in the processing line equipment according to the present invention.

DETAILED DESCRIPTION OF THE PREFERRED EMBODIMENTS

The present invention now will be described more fully hereinafter with reference to the accompanying drawings. In this specification, it is understood that equipment can refer to a stand-alone apparatus or a group of such apparatuses. It is also understood that the state of equipment can be the value of a single parameter or an array of values corresponding to several parameters. It is also understood that any predetermined values can be provided in any number of conventional ways known to those of ordinary skill in the art, including, for example, an on-line storage device, a look-up-table, and manual input by an operator.

Figure 1:
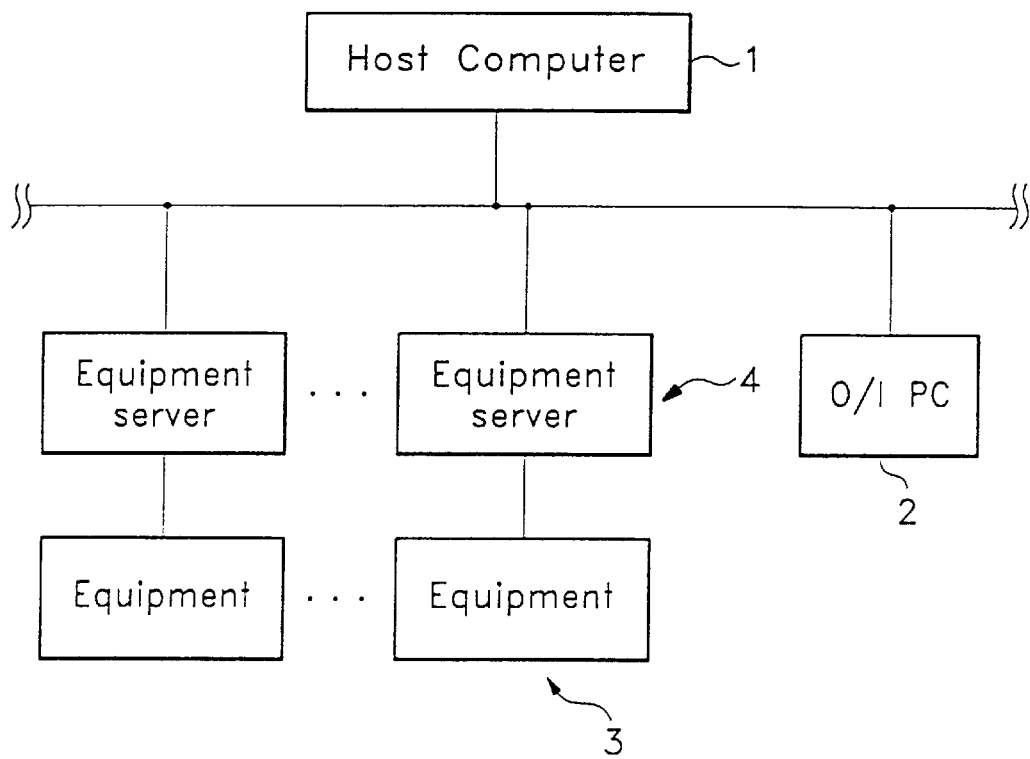
FIG. 1 is a schematic block diagram of a conventional controlling system for semiconductor manufacturing equipment in a processing line.
Figure 2:
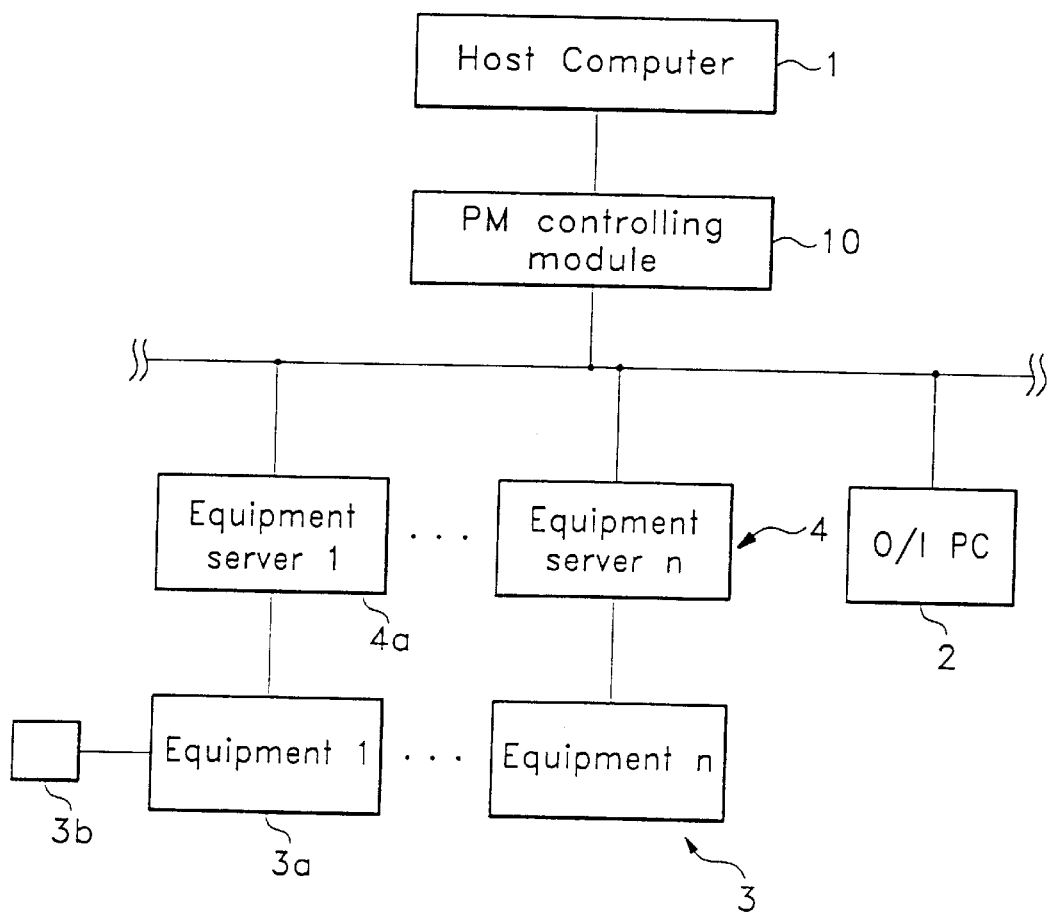
FIG. 2 is a schematic block diagram of a controlling system for semiconductor manufacturing equipment in a processing line using the present invention therein.

As shown in FIG. 2, a preventative maintenance (PM) controlling module 10 is connected on-line to equipment servers 4 and a host computer 1. When the PM controlling module 10 is installed, the equipment servers 4 are also provided with an appropriate reporting function so that the operational parameter data of the respective equipment 3 can be reported to the PM controlling module 10 automatically, in real time.

The equipment 3 are connected on-line to the corresponding equipment servers 4 using a communication protocol, e.g., the SEMI Equipment Communications Standard (SECS). The equipment servers 4 are connected on-line to the PM controlling module 10 using a communications protocol, e.g., TCP/IP. An operator interface (O/I) 2, for example an operator interface personal computer (O/I PC), is also connected on-line to the host computer 1 through the PM controlling module 10.

According to the received operational parameter data, the PM controlling module automatically controls preventative maintenance (PM) cycles for the corresponding equipment 3. Therefore, the PM cycles for the equipment 3 can be accurately controlled without any intervention of the operators, which results in considerably enhanced efficiency.

Figure 3:
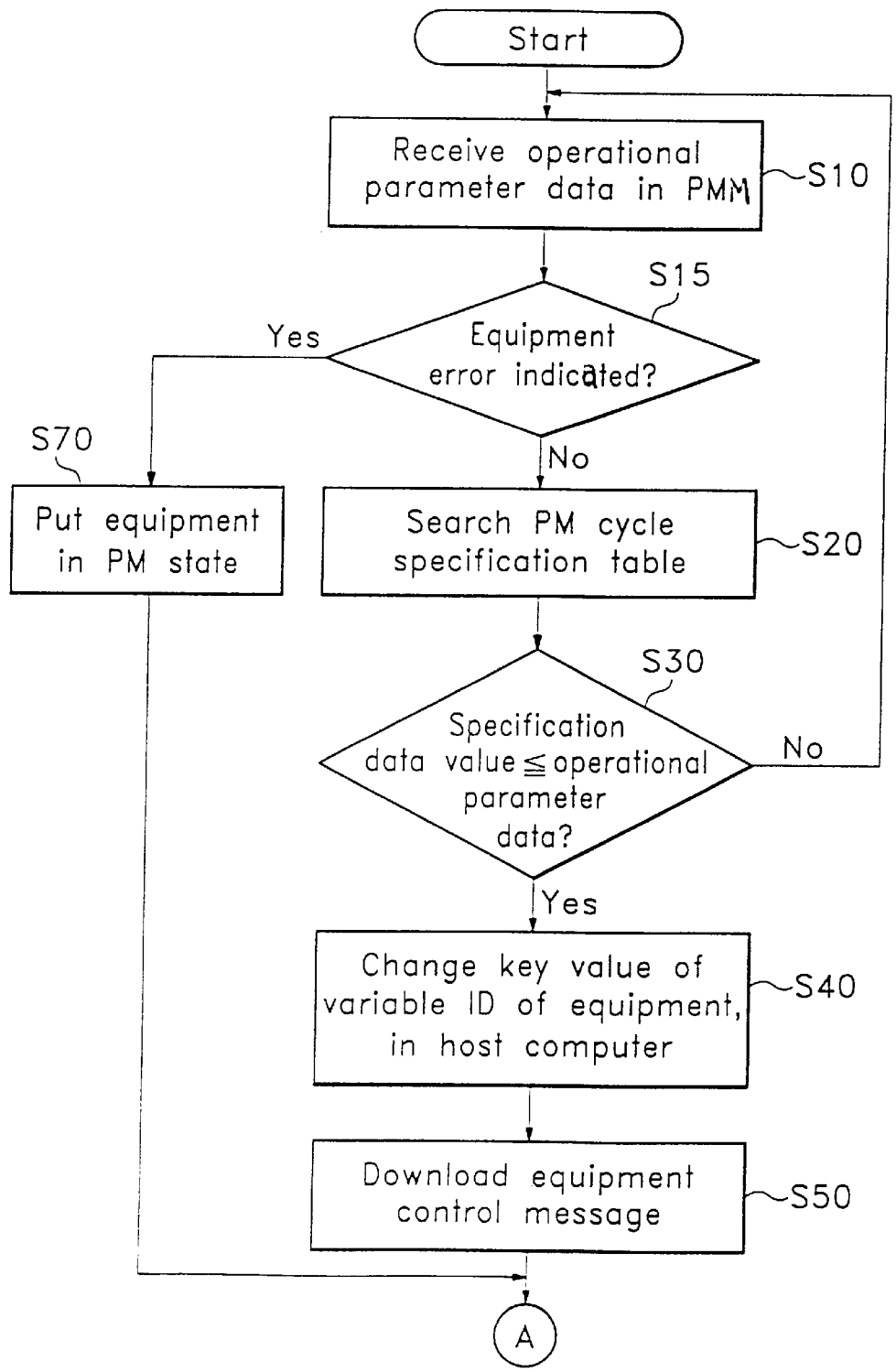
FIG. 3 is a flowchart of a method for automatically controlling preventative maintenance (PM) cycles according to the present invention.

As shown in FIG. 3, in one embodiment, the PM controlling module 10 initiates preventative maintenance upon the occurrence of an equipment error. The PM controlling module 10 receives automatically, in real time, the operational parameter data from the respective equipment 3 through the equipment servers 4 (S10). The operational parameter data can be checked to determine if an equipment error is indicated (S15). In the event that the operational parameter data of a certain piece of equipment 3, e.g., a first equipment 3a, indicate that an error has occurred, the PM controlling module 10 automatically changes the operating state of the first equipment 3a into a preventative maintenance state, and thus prevents any lot from being introduced into the first equipment 3a. Thereafter, the operator performs maintenance on the first equipment 3a, immediately. Thereby, operational problems caused by introducing lots into faulty equipment 3 can be prevented.

Otherwise, as shown in FIG. 3, the PM controlling module 10 initiates preventative maintenance according to predetermined cycles. The PM controlling module 10 receives automatically, in real time, the operational parameter data from the respective equipment 3 through the equipment servers 4 (S10). The operational parameters, such as the amounts of time the corresponding equipment 3 has been operating and the numbers of wafers that have been processed in the corresponding equipment 3, are therefore immediately recognized by the PM controlling module 10.

The PM controlling module 10 then searches a PM cycle specification table stored in a data base, for example on the host computer 1, and extracts specification data corresponding to that equipment, i.e., the PM controlling module retrieves the specification data from the specification maintenance cycle data base (S20). The PM controlling module 10 then determines whether the values of the retrieved operational parameter data exceed the values of the specification data given in the PM cycle specification table (S30).

If it is determined that all the values of the operational parameter data do not exceed the corresponding values of the specification data, then no equipment 3 needs to be subjected to preventative maintenance and the PM controlling module 10 returns the controlling method flow to the first step S10 of receiving the operational parameter data.

Otherwise, if it is determined that any of the values of the operational parameter data for a certain piece of equipment 3 exceeds the corresponding value of the specification data, then that certain piece of equipment 3 needs to be subjected to preventative maintenance. In this case, the need for preventative maintenance at that piece of equipment 3 is indicated in a variable ID for that certain piece of equipment 3.

In a preferred embodiment, the PM controlling module 10 transmits the results of the comparison of operational parameters and specification data to the host computer 1. Then, the host computer 1 changes the key value of the variable ID of the certain piece of equipment 3 to indicate the preventative maintenance state (S40). For example, in the event that the value of the specification data related to the amount of the time for operating the first equipment 3a is 35,000 hours as shown in FIG. 5 and the value of the received operational parameter related thereto is 35,001 hours, the PM controlling module 10 determines that the first equipment 3a needs to be subjected to preventative maintenance, e.g., a cleaning step. In this example, the PM controlling module 10 transmits the determination to the host computer 1. Then the host computer 1 changes the key value of the variable ID of the first equipment 3a into the preventative maintenance state immediately so that the first equipment 3a is subjected to preventative maintenance and is no longer used for processing lots. In the preferred embodiment, the variable ID changed by the host computer 1 is either the Equipment Constant ID (ECID) or the Status Variable ID (SVID) which are capable of changing the state of the first equipment 3a. In the preferred embodiment, the PM controlling module 10 then receives the variable ID having the changed key value from the host computer 1.

After the step S40 of changing the key value of the variable ID of the certain equipment, the PM controlling module 10 loads the variable ID having the changed key value into an equipment control message and downloads the equipment control message into the first equipment 3a through the first equipment server 4a (S50). As a result, the operating state of the first equipment 3a is changed into the preventative maintenance state substantially immediately.

In the preferred embodiment, during S50, the equipment control message downloaded from the PM controlling module 10 is a stream function message that allows smooth communication. Preferably, the stream function format of the equipment control message is either the S2F15 format or the S2F41 format that are suitable for standard communications.

For example, if it is recognized that the operational data exceed the specification data for the first equipment 3a, the PM controlling module 10 modifies the operating state of the first equipment 3a into the preventative maintenance state as follows. First, the PM controlling module 10 receives from the host computer 1 an ECID with the key value changed into the preventative maintenance (PM) state. Then, the PM controlling module 10 loads the ECID in a stream function message, i.e., S2F15 or S2F41, and downloads S2F15 or S2F41 with the ECID loaded thereon into the first equipment 3a. As a result, the state of the first equipment 3a is changed into the PM state.

In the conventional controlling system, since the PM cycle events are determined by the subjective determination of an operator who monitors the equipment, the actual PM cycles vary with the operators. As a result, it is difficult to achieve consistency in performing the preventative maintenance for the equipment. In the event that the PM cycle event is not detected in a timely way, the equipment may be damaged.

However, in the controlling system according to the present invention, the preventative maintenance cycles for the equipment 3 are consistently controlled by the host computer 1 through the PM controlling module 10 which receives the operational parameter data of the equipment. Accordingly, the equipment are subjected to preventative maintenance on a uniform basis, which prevents, in advance, the equipment from being damaged.

Figure 4:
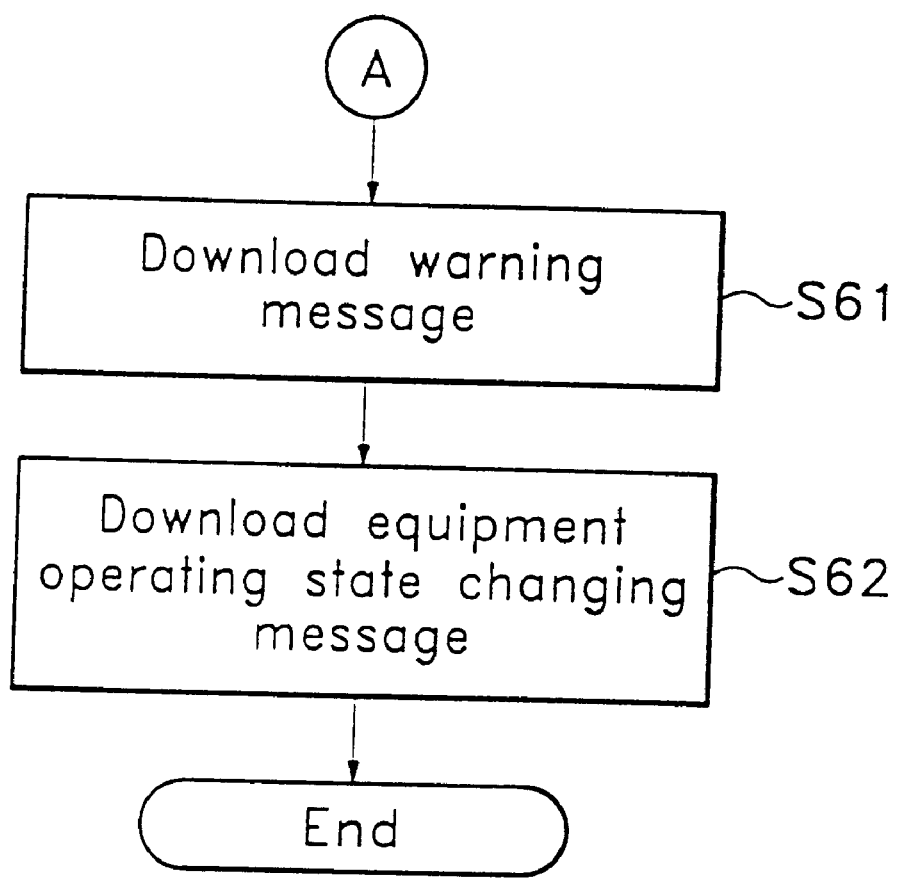
FIG. 4 is a flowchart of a preferred embodiment of a method for automatically controlling preventative maintenance cycles according to the present invention.

In addition, in another embodiment shown in FIG. 4, after the step S50 of downloading the equipment control message into the equipment 3, the PM controlling module 10 may download a warning message with text into the certain piece of equipment, e.g., first equipment 3a through the first equipment server 4a. This message can be displayed at a monitor on a console of the certain piece of equipment so that the operator can visually recognize the fact that a change in state has occurred in that equipment 3a (S61). For example, the PM controlling module 10 downloads a warning message with the text "the first equipment needs to be cleaned" into the first equipment 3a so that the operator can recognize immediately that preventative maintenance for the first equipment 3a is due.

Thereafter, according to the contents of the text, the operator performs preventative maintenance on the first equipment 3a.

Preferably, similar to the equipment controlling message, the warning message is a stream function message that allows smooth communication. Preferably, the stream function format of the warning message is either an S10F3 format or an S10F5 format that are suitable for standard communications. The S10F5 format is capable of transmitting more text than the S10F3 format.

In this embodiment, the PM controlling module 10 also downloads an equipment operating state change message. The equipment state change message changes the operating state displayed on the O/I 2, e.g., O/I PC 2, to the latest state (S62). Accordingly, the equipment operating state displayed on the O/I PC 2 is appropriately changed according to the latest information.

For example, the O/I PC 2 receives operating states of the respective equipment 3 from the host computer 1, displays the operating states as "RUN" or "IDLE" which means that the equipment can be operated, or as "DOWN" or "PM" which means that the equipment cannot be operated. According to the displayed information, the operator performs the processes more efficiently.

Because the PM controlling module 10 displays the latest information, operational problems due to faulty commands by the operator can be prevented. For example, when the state of the first equipment 3a is changed from "RUN" to "PM," the PM controlling module 10 downloads an equipment operating state change message into the O/I PC 2 to change the contents of the information to be displayed into "PM," as shown in FIG. 6, immediately. By virtue of this displayed "PM," the operator does not route a lot into the first equipment 3a, and operational problems are avoided.

The format of the equipment operating state change message may vary with the O/I PC 2 in ways known to those of ordinary skill in the art.

The host computer 1 and PM controlling module 10 may then repeatedly perform the above steps, which results in enhanced efficiency in controlling the PM cycle of the equipment.

According to the present invention, the PM cycles for the respective equipment can be automatically controlled through the PM controlling module. As a result, preventative maintenance is performed at a proper time for each piece of equipment on the processing line. Thereby, the PM cycles for the respective equipment can be consistently controlled without any intervention by the operators. The equipment thus can be protected from being damaged due to faulty detection of the PM cycle events by the operator. As a result, the manufacturing efficiency of the whole processing line is considerably enhanced.

This invention has been described above with reference to the aforementioned embodiments. It is evident, however, that many alternatives, modifications and variations will be apparent to those having skill in the art in light of the foregoing description. For example, the present invention can be applied to various semiconductor manufacturing equipment which are arranged in a processing line and need preventative maintenance performed at predetermined cycles without degradation of efficiency. Accordingly, the present invention embraces all such alternatives, modifications and variations as fall within the spirit and scope of the appended claims and their equivalents.

What is claimed is:

1. A method for controlling equipment in a semiconductor fabrication system, the method comprising:

automatically receiving, at a preventative maintenance module (PMM) in data communication with a host computer, operating parameter data from equipment in a semiconductor fabrication system;

retrieving, by the PMM, specification data corresponding to the equipment, from a preventative maintenance cycle data base;

determining, at the PMM, whether any of the operating parameter data exceeds the specification data;

changing, in the host computer, a key value of a variable ID corresponding to the equipment, if any of the operating parameter data exceeds the specification data; and modifying an operating state of the equipment, including inserting the variable ID into an equipment control message and downloading the equipment control message to the equipment, after said changing the key value.

2. The method of claim 1, wherein, during said modifying, the equipment control message is a stream function message.

3. The method of claim 2, wherein, during said modifying, the stream function message is formatted in one of an S2F15 format and an S2F41 format.

4. The method of claim 1, wherein, during said changing a key value, the variable ID is one type of an ECID type and an SVID type.

5. The method of claim 1, further comprising returning to said automatically receiving, if the operating parameter data do not exceed the specification data.

6. The method of claim 1, after said modifying, further comprising returning to said automatically receiving.

7. The method of claim 1, said changing the key value further comprising:

sending results of said determining from the PMM to the host computer;

resetting the key value of the variable ID on the host computer; and sending the variable ID from the host computer to the PMM.

8. The method of claim 1, after said automatically receiving and before said retrieving specification data, further comprising:

identifying whether the operating parameter data indicate an equipment error at the equipment;

placing the equipment in a preventative maintenance state if the operating parameter data indicate an equipment error.

9. A method for controlling equipment in a semiconductor fabrication system, the method comprising:

automatically receiving, at a preventative maintenance module (PMM) in data communication with a host computer, operating parameter data from equipment in a semiconductor fabrication system;

retrieving, by the PMM, specification data corresponding to the equipment, from a preventative maintenance cycle data base;

determining, at the PMM, whether any of the operating parameter data exceeds the specification data;

changing, in the host computer, a key value of a variable ID corresponding to the equipment, if any of the operating parameter data exceeds the specification data;

modifying an operating state of the equipment, including inserting the variable ID into an equipment control message and downloading the equipment control message to the equipment, after said changing the key value;

downloading a warning message from the PMM into the equipment for display at an equipment monitor; and downloading an equipment state change message from the PMM into an operator interface console for display at an operator interface monitor.

10. The method of claim 9, wherein, during said downloading the warning message, the warning message is a stream function message.

11. The method of claim 10, wherein, during said downloading the warning message, the stream function message is formatted in one of an S10F3 format and an S10F5 format.

* * * * *